United States Patent [19]

Boehm

[11] Patent Number: 4,947,219
[45] Date of Patent: Aug. 7, 1990

[54] PARTICULATE SEMICONDUCTOR DEVICES AND METHODS

[75] Inventor: Marcus Boehm, Plainsboro, N.J.

[73] Assignee: Chronar Corp., Princeton, N.J.

[21] Appl. No.: 860

[22] Filed: Jan. 6, 1987

[51] Int. Cl.[5] ............... H01L 29/06; H01L 27/14; H01L 31/00
[52] U.S. Cl. .................................. 357/20; 357/15; 357/30; 136/250
[58] Field of Search ............... 357/30 J, 30 Q, 30 K, 357/20, 15; 136/250

[56] References Cited

U.S. PATENT DOCUMENTS

| | | | |
|---|---|---|---|
| 2,904,613 | 9/1959 | Paradise | 156/662 X |
| 4,021,323 | 5/1977 | Kilby et al. | 156/625 X |
| 4,514,580 | 4/1985 | Bartlett | 357/72 X |
| 4,654,468 | 3/1987 | Nath et al. | 357/65 X |

OTHER PUBLICATIONS

Van Viack, *Elements of Material Science*, Addison-Wesley, 1964, pp. 384–386.

Primary Examiner—Andrew J. James
Assistant Examiner—Sara W. Crane
Attorney, Agent, or Firm—George E. Kersey

[57] ABSTRACT

Particulate semiconductor devices and method of preparation by a low temperature process. A particulate layer is screen printed on a metallized substrate and a rear contact is formed by alloying the semiconductor particules to the substrate. The layer is fired and a front Schottky contact applied. The resulting device has sharp diode IV-characteristics, low leakage current, and significant reverse break-down voltages. In the manufacture of efficient and red-enhanced particulate silicon pn-junction solar cells, prediffused particles are used, offering major advantages compared to other techniques, such as where the junction is formed after completion of a particulate layer.

15 Claims, 4 Drawing Sheets

PARTICULATE SEMICONDUCTOR DEVICES AND METHODS

BACKGROUND OF THE INVENTION

This invention relates to particulate semiconductor devices, particularly high efficiency photovoltaic devices.

Although considerable progress has been made in the cost-effective manufacture of large area devices, particularly large area amorphous silicon devices, the efficiencies of mass produced solar panels are in need of improvement. While laboratory schemes can produce small area amorphous silicon devices with efficiencies over 10%, it is difficult to raise the mass production efficiency to over 7-10% with a single junction structure.

Accordingly, it is an object of the invention to develop low cost solar cells for mass produced panels with efficiencies of well over 10%.

One approach has been to combine, in tandem, an amorphous silicon top cell and a crystalline silicon bottom cell. Such a configuration has not been realized to date at a reasonably low cost. Another approach is to use amorphous silicon and amorphous silicon alloys. This does not provide a good match of bandgaps. The reason is that the bandgap of amorphous silicon alloys cannot be changed within the necessary range without seriously degrading the electrical properties of the absorbing layer.

Accordingly, it is a further object of the invention to develop low cost crystalline silicon devices. Such devices are inherently stable.

One approach to cost reduction for crystalline silicon is the production of solar cells from cast polycrystalline silicon ignots. This process has the advantage that no single crystals need to be grown, a step which is time and energy consuming. Although the remaining process steps are essentially those used in the manufacture of single crystalline solar cells, costs are reduced by a factor of more than two and energy amortization time is reduced from ten years to approximately one year.

Another approach is to use silicon ribbon technology where wafers need not be cut from an ingot. Thus processing time and material loss are reduced. These advantages are offset by numerous manufacturing problems associated with handling and processing liquid silicon (at 1414 degrees Centigrade), and the growing of polycrystalline film.

A further attempt to realize low cost crystalline thin film cells involves temperature gradient liquid phase epitaxy out of a silicon-tin solution. The growth temperatures range from 800-1000 degrees Centigrade and thus are markedly lower than the melting point of silicon. Stainless steel is used as a substrate. Efficiencies close to 10% have been reported for small area devices. However, in this method there is a lattice mismatch between the substrate and the grown layer, which inhibits continuous film growth and ultimately reduces efficiency. Furthermore the growth temperature is still very high, confining the choice of materials that are suitable as substrates.

A different approach involves the use of silicon particles. A slurry consisting of silicon particles, water, and polyvinylalcohol is spread on a suitable heat-resistant substrate. Subsequently the particulate layer is re-melted. Efficiencies of 5% have been reported, but high-cost substrates are required.

Another approach is by fusing silicon particles with a pulsed electric current. No useful devices have been reported to date.

A further approach is to sinter silicon particles to an aluminum coated, stainless steel substrate. The particulate layer is covered with an insulating material, e.g. a resin or a low temperature glass, in order to fill voids and to seal the rear contact. The top surface is then ground or etched to expose bare silicon. Finally a junction is formed by ion implantation, epitaxial deposition, or diffusion. While ion implantation appears feasible, epitaxial deposition and diffusion are questionable. The particulate layer is not capable of withstanding temperatures higher than the melting or flaming point of the sealant or the melting point of the aluminum.

The foregoing particulate devices use crushed or milled particles prepared from a single or polycrystalline ingot. Usually the particles are etched after milling in order to remove surface contamination. Silicon ball mills and silicon lumps as grinding media are used to minimize contamination.

SUMMARY OF THE INVENTION

In accomplishing the foregoing and related objects, the invention provides a particulate semiconductor device with a substrate including a metallic layer, a layer of particles upon the substrate, and an alloy of the metallic layer and the particles between the substrate and the particles. The device is completed by a semi-transparent layer upon the particulate layer.

In accordance with one aspect of the invention each particle has a core and a shell with a specified electrotransport characteristic. The alloy forms an ohmic contact with the core and a non-ohmic contact with the shell. The particulate layer can include a glass frit and a binder, which can be organic. The organic binder can serve as a carrier for applying the particulate layer. When the particulate layer is screen printed, the binder is advantageously an organic alcohol or cellulose (gum) or acetate.

In accordance with another aspect of the invention the metal of the metallic layer provides a doping effect on the particles. The metallic layer can act as a dopant or it can include a separate dopant.

In a method of fabricating a particulate semiconductor device in accordance with the invention, a substrate is provided that includes a metallic layer which can form an alloy with a semiconductor. A layer of semiconductor particles is applied to the substrate containing an insulator. The layer is subjected to a prescribed multifunctional and multipurpose temperature cycle. The device is completed by applying the front contact in the form of the metallic grid and applying a transparent conductive layer to permit lateral conductivity among the particles.

In accordance with yet another aspect of the invention the temperature cycle includes the step of alloying the metal and the semiconductor and subsequently recrystallizing the semiconductor to form at least one zone with specified electrotransport characteristics. The recrystallization produces both an ohmic contact with the core of particles and a rectifying contact with the semiconductor shell.

DESCRIPTION OF THE DRAWINGS

Other aspects of the invention will become apparent a considering several illustrative embodiments taken in conjunction with the drawings in which.

DETAILED DESCRIPTION

(a) Overview

Figure 1:
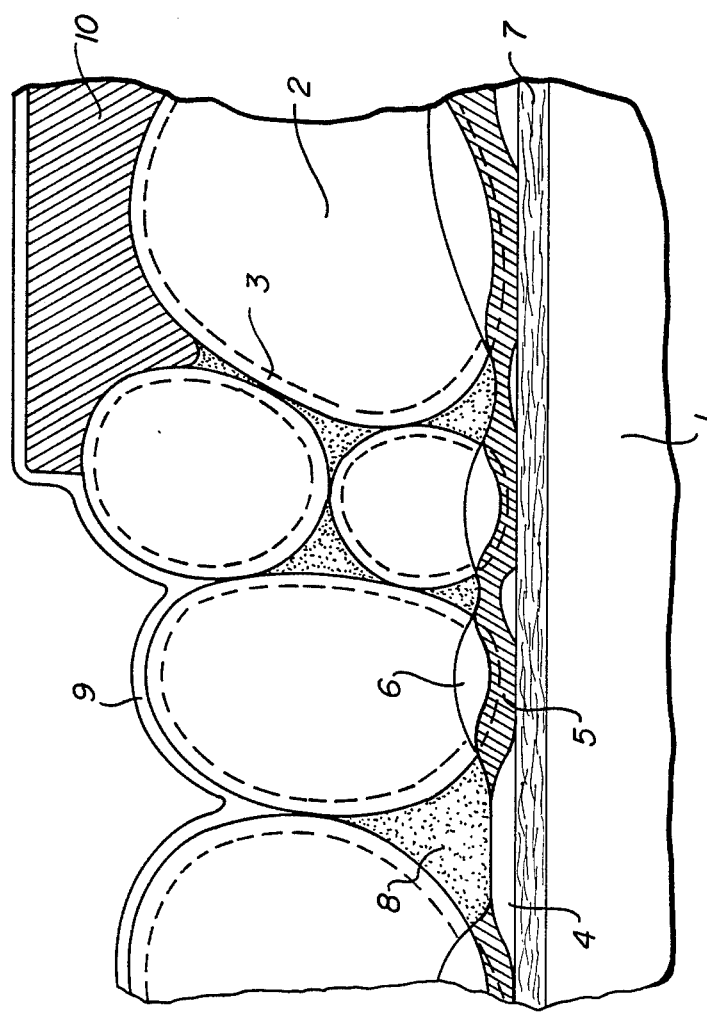
FIG. 1 is a cross sectional view of a particulate semiconductor device in accordance with the invention.

Particulate devices in accordance with the invention, such as the device 100 in FIG. 1, are prepared from available silicon particles. N and p type powders of small grain size are suitable. Screenprinting is then used to apply a layer of the particles 2 on a substrate 1. The formation of the rear contact 4, 5, 6, firing of the layer 2, 3 and sealing of the rear contact 4, 5, 6 with a glass frit 8 are performed in a single step. This is achieved by exposing the printed layer to a specific temperature cycle.

Neither subsequent coating with an insulator nor grinding is necessary. This procedure significantly reduces the number of process steps. Finally a grid 10 and a semi-transparent conductive front electrode 9 is applied to the fired particulate layer 2, 3. The process provides good quality devices. An underlying metallic layer 7 on the substrate 1 is desirably included to improve lateral conductivity of the rear contact 4, 5, 6.

(b) Screenprinting of the Particulate Silicon Layer (2, 3)

For printing the particulate silicon layer 2, 3 a screenable paste is prepared. The silicon particles are degreased and etched. Subsequently, the silicon particles are mixed with an organic binder to serve as a vehicle for screenprinting. The optimal binder is inert and volatizes completely after printing. Suitable binders include polyvinylalcohol and those based on ethyl cellulose.

While the organic binder serves as a vehicle for printing, another constituent is necessary to prevent the particulate layer from disintegrating after firing. Besides acting as an adhesive, the added constituent insulates the rear contact to avoid shunting of particles. Very fine grained glass powders are used. These powders desirably meet two major requirements: First, a specified melting point which depends on the rear contact material and the chosen alloying parameters; second, the omission of components that would seriously degrade the lifetime of carriers in the silicon particles.

Square ceramic plates are suitable substrates. Other substrate materials like stainless steel, quartz or glass may also be used. A molybdenum layer 7 is evaporated on the substrate followed by either an aluminum or a gold layer 4. The gold layer contains antimony. Aluminum is a p-type dopant, antimony an n-type dopant in silicon. Aluminum and gold provide rear alloy contacts to the particles 2. Molybdenum 7 both improves the lateral conductivity and acts as a diffusion barrier for gold.

(c) Formation and Sealing of Rear Contact

The rear contact is formed by alloying the silicon particles of the layer to the evaporated rear side aluminum or old-antimony layer. The alloying technique produces highly doped p+ (aluminum) or n+ zones (gold-antimony) at very low temperatures. It is based on the fact that silicon and aluminum or silicon and gold form alloys, which, depending on the composition, can be liquid at temperatures below the melting point of either of the components. This is indicated in phase diagrams. Aluminum and silicon form a eutectic alloy at 557 degrees Centigrade (12.60% Al, 87.40% Si), gold and silicon form a eutectic alloy at 363 degrees Centigrade (2.85% Au, 97.15% Si).

Figure 2:
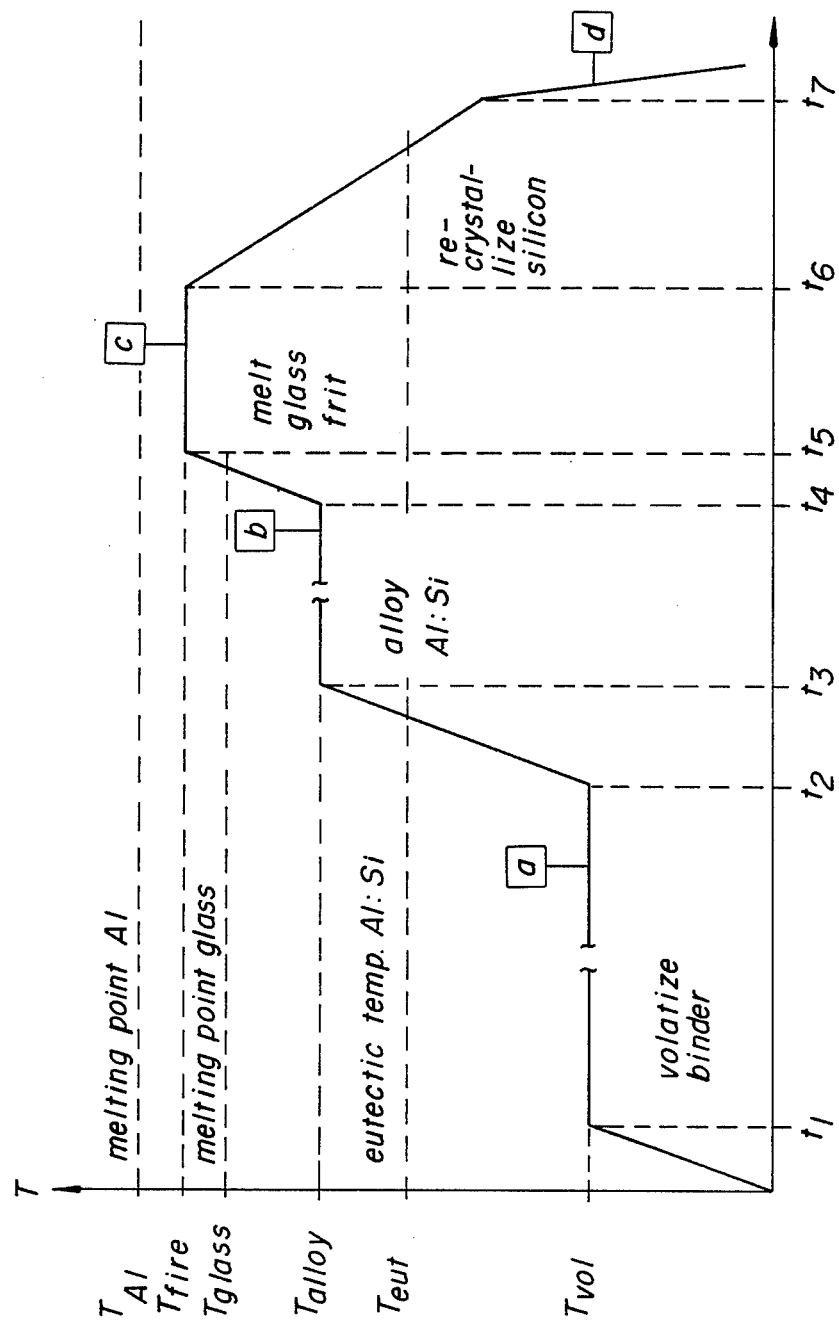
FIG. 2 is a graph of typical temperature cycle for forming a contact with a semiconductive particle in accordance with the invention.

A typical temperature cycle for the formation of a p+ contact is shown in FIG. 2. The FIGS. 3-6, illustrate the corresponding process steps.

Figure 3:
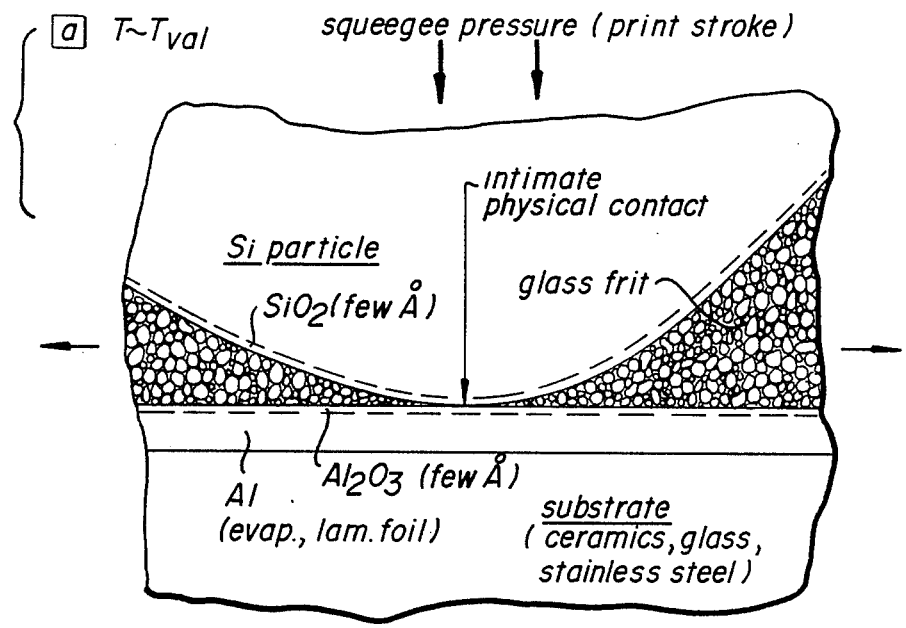
FIG. 3 is a cross sectional view of a semiconductive particle applied to a substrate in accordance with the invention.

After printing, the sample is kept at room temperature until most of the organic binder volatizes. The sample is then loaded in the quartz tube of a horizontal tube furnace and heated under constant argon flush to thoroughly volatize the remaining binder (FIG. 3). The inert atmosphere prevents the silicon and the aluminum from oxidizing.

Figure 4:
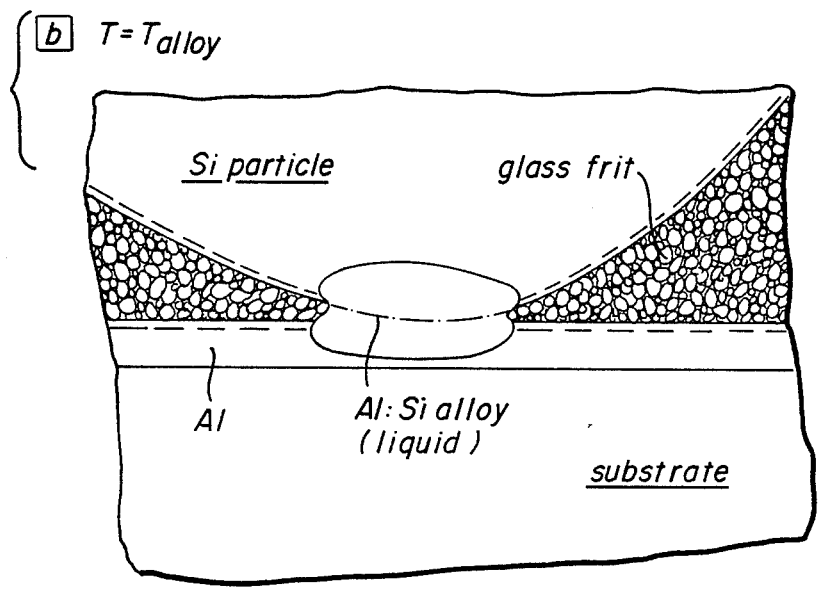
FIG. 4 is a cross sectional view showing the formation of a metal semiconductor alloy at the interface of a semiconductor particle with a substrate in accordance with the invention.
Figure 5:
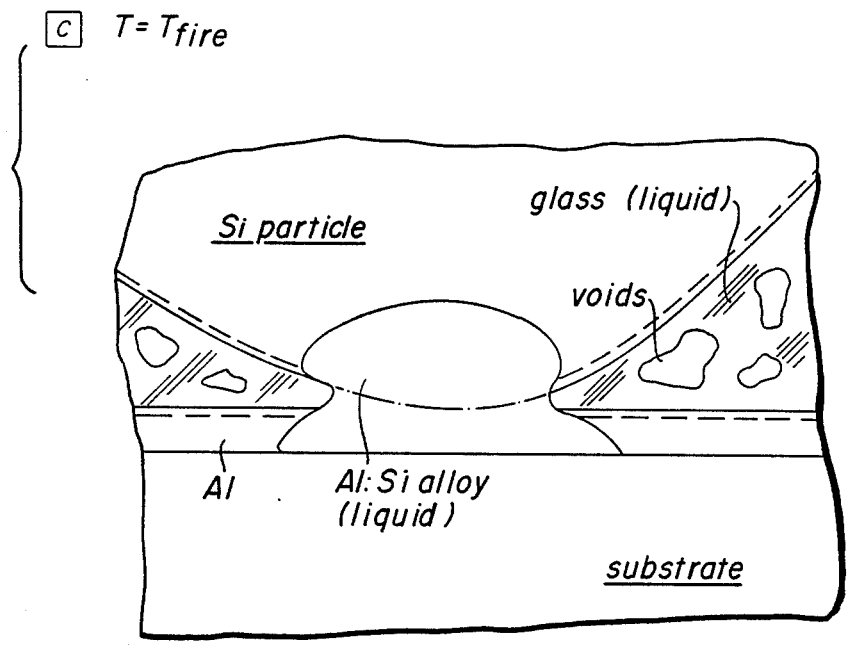
FIG. 5 is a cross sectional view of FIG. 4 showing the melting of the filler between a semiconductive particle and a substrate in accordance with the invention.

The temperature is then increased to a value somewhat higher than the eutectic temperature, typically 600 degrees Centigrade. A liquid Al—Si alloy is formed at the interface (FIG. 4). An intimate physical contact between the silicon particles and the aluminum is a prerequisite for the formation of an alloy. This close contact is established during the print stroke. Experimental results show that pressure on the particles need not necessarily be applied during the alloying procedure. Inevitable thin oxide does not affect the formation of an alloy. Usually, however, the alloying time is fairly long, typically four hours. During this step the glass particles remain solid.

The temperature is then increased to a value somewhat higher than the melting point of the glass frit (FIG. 5), which is lower than the melting point of the rear side metal. If aluminum is used, a typical melting point for the glass frit is 640 degrees Centigrade. The choice of a frit with a suitable melting point is less critical for gold as rear side contact material since the temperature difference between the melting point of the gold and the eutectic temperature is 701 degrees Centigrade, whereas the corresponding temperature range for aluminum is only 83 degrees Centigrade.

While increasing the temperature to liquidize the glass the alloyed region also extends into the core of the particle. More silicon is dissolved according to the phase diagram, as is more aluminum. The aluminum, however, is present in limited quantity. Both the alloy and the glass are then in the liquid state. Preferably the chosen glass and the alloy do not wet each other.

Figure 6:
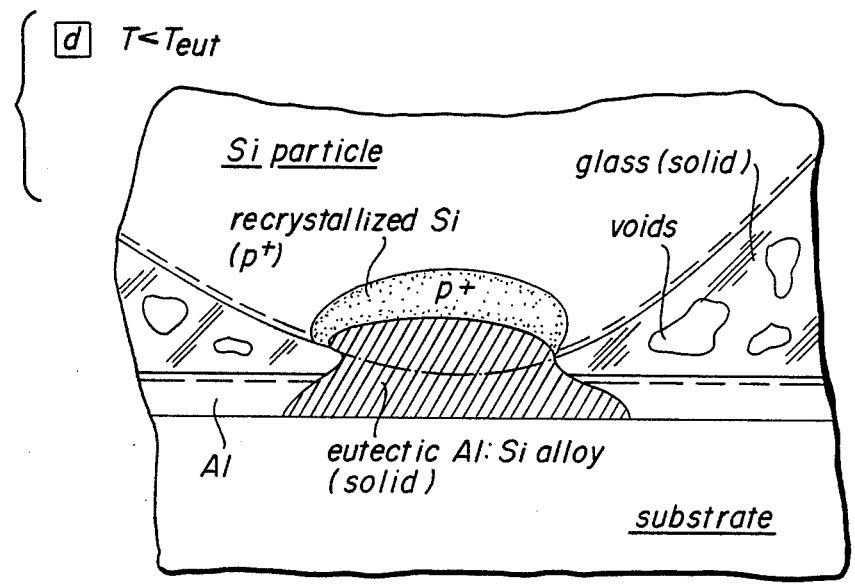
FIG. 6 is a cross sectional view of FIG. 5 showing the formation of a contact between a substrate and a semiconductor particle by recrystallization in accordance with the invention.

Finally the sample is cooled with an initial cooling rate of less than 1 degree Centigrade/minute. The silicon content in the alloy decreases according to the phase diagram and the excess silicon recrystallizes (FIG. 6). Aluminum or antimony are incorporated into the recrystallized zone according to their segregation coefficients. This results in either p+ or n+ doped recrystallized zones. Impurities with a segregation coefficient smaller than 1 accumulate preferentially in the liquid alloy. Incorporation of impurities into the recrystallized zone, e.g. impurities that originate from the glass frit, is not critical since the recrystallized zones act as contacts only. The degradation of lifetime in these areas is unimportant for the device performance. As soon as the temperature falls below the eutectic temperature, the remaining alloy solidifies. It then has eutectic composition and forms the rear contact.

Voids in the solidified glass are inevitable but are of minor significance to device performance.

(d) Device Structures

After the formation and sealing of the rear contact a rectifying front electrode is applied to the particles. A conductive silver epoxy paste is printed on top of the particulate silicon layer and forms good rectifying contacts to both n and ptype silicon.

The paste is cured at a relatively low temperature, typically 190 degrees Centigrade. The particulate silicon layer does not need to be etched prior to the application in the front contact.

In addition or in place of the silver epoxy paste, a metal electrode may be evaporated. Pure gold forms a rectifying Schottky contact to n-type silicon. The metal electrodes have to be applied after curing of the silver epoxy paste. Otherwise they would tend to form ohmic contacts to the particles during the heat treatment.

There are a number of suitable device structures for particulate silicon Schottky devices. For p-type particles aluminum is the rear contact, and for n-type particles goldantimony is the rear contact.

Other information is from dark IV-characteristics of two small area particulate silicon Schottky diodes. The diodes exhibit a low leakage current and a good reverse break down voltage of greater than 5 volts.

The lateral conductivity of particulate layers is illustrated in a number of examples for IV-characteristics measured between adjacent contacts of a particulate layer printed on an insulating substrate. The lateral current flow is governed by intra-particulate barriers and is described in terms of a series connection of numerous double Schottky barriers. The observed break down voltage of approximately 20 volts is surprisingly low and shows that current transport from one particle to another is possible. The results also suggest that the liquid glass falls and seals the rear contact and only a little glass remains between the particles.

(e) Particulate Silicon PN-Junction Devices

There are a number of device structures for efficient and red-enhanced particulate silicon solar cells. The devices are prepared as outlined above. However, prediffused particles are used and alloyed to the substrate. The rear electrode forms an ohmic contact to the core of the particle but a rectifying contact to the diffused layer. In a number of cases the diffusion paths of photogenerated minority carriers are short, no matter where they are generated in the particle. Once the carriers have reached the space charge region, current flow to the front contact is a field controlled majority carrier effect and does not depend on the diffusion length or the surface properties.

There also are calculated spectral response curves for a conventional monocrystalline n+/p cell. The plot shows that a high diffusion length is required to efficiently collect carriers generated by red photons. The reason is that red light penetrates deeply into the bulk of the semiconductor and minority carriers generated in the vicinity of the rear contact have to diffuse all the way through the base region to the front junction. Only if they reach the junction they contribute to the photocurrent. For the proposed particulate device these long diffusion lengths are not necessary, since the particles are surrounded by a junction.

Other aspects of the invention will be apparent to those of ordinary skill in the art. It will be understood that the foregoing detailed description is for illustration only and that substitutions, modifications, and equivalents may be used without departing from the spirit and scope of the invention as set forth in the dependent claims.

What is claimed is:

1. A particulate semiconductor device comprising
   a substrate with a metallic layer thereupon;
   a barrier layer between said metallic layer and said substrate;
   a particulate layer of particles upon said metallic layer;
   an alloy of said metallic layer and said particles between said substrate and said particulate layer; and
   a further layer upon said particulate layer.

2. The device of claim 1 wherein each particle has a core and a shell and said alloy forms an ohmic contact with said core and a nonohmic contact with said shell.

3. The device of claim 1 wherein said particulate layer includes a melted glass frit and a binder.

4. The device of claim 3 wherein the binder is organic.

5. The device of claim 4 wherein the organic binder provides a carrier for applying the particulate layer.

6. The device of claim 5 wherein the layer is screen printed and the binder is an organic alcohol, a cellulose gum, or an acetate.

7. The device of claim 1 wherein the metal of the metallic layer provides a doping effect on the particulate layer.

8. The device of claim 7 wherein the metallic layer acts as dopant.

9. The device of claim 7 wherein the particulate layer includes a dopant, for example, antimony.

10. The device of claim 1 wherein said barrier layer is molybdenum.

11. A particulate semiconductor device comprising
    a substrate including a metallic layer;
    a particulate layer of particles upon said substrate;
    an alloy of said metallic layer and said particles between said substrate and said particulate layer; and
    a further layer upon said particulate layer;
    wherein each of said particles includes a core and a prediffused layer surrounding said core, and said metallic layer forms an ohmic contact with cores of said particles and a rectifying contact with said said prediffused layer surrounding each core.

12. The device of claim 11 wherein said further layer forms a rectifying front electrode.

13. The device of claim 12 wherein said further layer is a conductive silver epoxy; thereby to form a good rectifying contact to both n and p semiconductors and avoid the need for etching of the particulate layer prior to application.

14. The device of claim 11 wherein said particles are doped and said alloy is more highly doped than the particles of said particulate layer.

15. The device of claim 3 wherein there there is nonwetting between said alloy and the melted glass frit.

* * * * *